United States Patent [19]
Sakai et al.

[11] Patent Number: 5,894,984
[45] Date of Patent: Apr. 20, 1999

[54] STRUCTURE OF ELECTRONIC PARTS AND METHOD OF SOLDERING ELECTRONIC PARTS TO SUBSTRATE

[75] Inventors: Tadahiko Sakai; Shoji Sakemi, both of Fukuoka; Teruaki Nishinaka, Kasuga, all of Japan

[73] Assignee: Matsushita Electric Industrial Co., Ltd., Osaka, Japan

[21] Appl. No.: 08/629,817

[22] Filed: Apr. 10, 1996

[30] Foreign Application Priority Data

Apr. 13, 1995 [JP] Japan ................................. 7-088106

[51] Int. Cl.⁶ .................................................. H01L 23/28
[52] U.S. Cl. .................................... 228/180.22; 257/787
[58] Field of Search ........................... 228/180.22, 180.1; 257/787, 737; 174/263

[56] References Cited

U.S. PATENT DOCUMENTS

| | | | |
|---|---|---|---|
| 5,154,341 | 10/1992 | Melton et al. | 228/180.22 |
| 5,282,565 | 2/1994 | Melton | 228/180.22 |
| 5,470,787 | 11/1995 | Greer | 438/614 |
| 5,535,101 | 7/1996 | Miles et al. | 257/787 X |
| 5,565,709 | 10/1996 | Fukushima et al. | 257/787 X |

*Primary Examiner*—Kenneth J. Ramsey
*Attorney, Agent, or Firm*—Lowe Hauptman Gopstein Gilman & Berner

[57] ABSTRACT

An improved structure of an electronic part with solder bumps is provided. The electronic part includes, for example, an IC chip and a board. The solder bumps are disposed on the bottom surface of the board and have a melting point greater than a thermal deformation temperature of the board. With this arrangement, if the curved board is bonded to a substrate in a soldering process, the solder bumps are solidified at a higher temperature than the thermal deformation temperature of the board during a cooling process, thereby preventing the curved board which has been straightened once above the thermal deformation temperature from being returned to its original shape. Several modifications are disclosed.

7 Claims, 8 Drawing Sheets

STRUCTURE OF ELECTRONIC PARTS AND METHOD OF SOLDERING ELECTRONIC PARTS TO SUBSTRATE

BACKGROUND OF THE INVENTION

1. Technical Field

The present invention relates generally to an improved structure of electronic parts with solder bumps and a method of soldering electronic parts with solder bumps to a substrate.

2. Background Art

In recent years, electronic parts such as IC chips with solder bumps are in widespread use in electronic equipment for high density arrangement of substrates.

Hereinbelow, a conventional sequence of processes of soldering electronic parts to a substrate will be discussed with reference to FIGS. 8(a) to 8(d).

First, a chip 3 is placed on a board 2. Electrodes of the chip 3 are then bonded to electrodes printed on the board 2 through lead wires 4, respectively. The chip 3 and the wires 4 are encapsulated by an encapsulating member 5. Disposed on a lower surface of the board 2 are solder bumps 6 each bonded to one of the wires 4. The board 2 is placed on a substrate 7 with the solder bumps 6 coinciding with electrodes 8 mounted on a substrate 7, respectively. The encapsulating member 5 is usually molded by transfer molding techniques. In the transfer molding, resin materials of both the board 2 and the encapsulating member 5 are heated above 150° C. and then cooled down to a room temperature at which the resin materials are solidified to form the encapsulating member 5. An epoxy resin and a glass epoxy resin are usually used as materials of the encapsulating member 5 and the board 2, respectively. Thus, the encapsulating member 5 is greater in thermal expansion coefficient than the board 2, so that cooling the encapsulating member 5 and the board 2 will cause the encapsulating member 5 to shrink more greatly than the board 2, thereby leading to the formation of set of an electronic part 1. This causes peripheral ones of the bumps 6 to be separate from the electrodes 8. It is experimentally found by the inventors of this application that the set of the electronic part 1 is cured temporarily by heating the electronic part 1. The test results show that the set of the electronic part 1 begins to be straightened quickly above 183° C. and then cured completely at about 185° C. which will be hereinafter referred to as a thermal deformation temperature. Although the thermal deformation temperature is changed depending upon size, thickness, or material, a typical one will be referred to in the following discussion.

After the electronic part 1 is mounted on the substrate 7 as shown in FIG. 8(a), they are put into a reflow heating furnace and then heated slowly. FIG. 2 shows a temperature profile of the reflow heating furnace. A melting point of the solder bumps 6 is 183° C.

Next, the substrate 7 is heated quickly from the room temperature up to about 150° C. and then heated slowly up to about 170° C. over a preheating zone shown in FIG. 2. The substrate 7 is heated quickly again over a reflow zone until a melting point of the solder bumps 6 is reached at 183° C. Subsequently, the substrate 7 is further heated up to a point b (thermal deformation temperature) so that the set of the electronic part 1 is, as shown in FIG. 8(b), cured so that it becomes flat.

The substrate 7 is further heated up to a maximum temperature of 230° C. at a point c. FIG. 8(c) shows the electronic part 1 at 230° C. The condition of the electronic part 1 in FIG. 8(c) is substantially identical with that in FIG. 8(b). After the maximum temperature is reached, the substrate 7 is cooled quickly. When the temperature in the heating furnace is decreased below 185° C. at a point d, it will cause the board 2 to be curved again. At 183° C. (point e), the solder bumps 6 are solidified, as shown in FIG. 8(d).

As discussed above, the decrease in temperature of the heating furnace below 185° C. (i.e., the thermal deformation temperature) in the cooling process causes the board 2 to be curved again, as shown in FIG. 8(d), due to the difference in thermal expansion coefficient between the encapsulating member 5 and the board 2. Since the solder bumps 8 are not yet solidified at 185° C., the electronic part 1 is attracted downward by the surface tension of the molten solder bumps 6 and the weight of the electronic part 1, so that the central solder bumps 6 are greatly pressed against the substrate 7 and then expanded laterally, thereby leading to the formation of bridges 9 which cause short-circuits to occur.

SUMMARY OF THE INVENTION

It is therefore a principal object of the present invention to avoid the disadvantages of the prior art.

It is another object of the present invention to provide an electronic part designed to bond solder bumps to electrodes of a substrate correctly without formation of bridges across adjacent ones of the electrodes.

According to one aspect of the present invention, there is provided an electronic part which comprises a board, a circuit element having electrodes, disposed on the board, and solder bumps disposed on the board, each connected to one of the electrodes of the circuit element. The solder bumps are made of solder having a melting point greater than a thermal deformation temperature of the board.

In the preferred mode of the invention, the circuit element is disposed on a first surface of the board. The solder bumps are disposed on a second surface of the circuit board opposite the first surface.

An encapsulating member is provided for encapsulating the circuit element using a given molding material. The melting point of the solder bumps is also greater than a thermal deformation temperature of the encapsulating member.

According to another aspect of the invention, there is provided an electronic part which comprises a board, a circuit element having electrodes, disposed on the board, and a plurality of solder bumps disposed on the board, each connected to one of the electrodes of the circuit element. The solder bumps includes a first group and a second group arranged around the first group. The solder bumps of the first group are greater in size than the solder bumps of the second group.

According to a further aspect of the invention, there is provided an electronic device which comprises a board, a circuit element disposed on the board having electrodes, a solder bumps disposed on the board each connected to one of the electrodes of the circuit element, and a substrate having disposed thereon electrodes each connected to one of the solder bumps. The electrodes of the substrate includes a first group and a second group arranged around the first group. The electrodes of the first group have contact surfaces contacting with the solder bumps which are greater in area than contact surfaces of the electrodes of the second group.

In the preferred mode of the invention, each of the contact surfaces of the first group of the electrodes is of circular shape.

Each of the contact surfaces of the first group of the electrodes may be of oval shape. The oval contact surfaces of the first group of the electrodes have lengths oriented in parallel to each other.

According to a still further aspect of the invention, there is provided an electronic device which comprises a board, a circuit element disposed on the board having electrodes, solder bumps disposed on the board each connected to one of the electrodes of the circuit element, a substrate having disposed thereon electrodes each connected to one of the solder bumps, the electrodes of the substrate including a first group and a second group arranged around the first group, and a storage means for storing therein at least part of the solder bumps connected to the first group of the electrodes of the substrate.

In the preferred mode of the invention, the storage means includes through holes formed in the first group of the electrodes of the substrate.

The storage means may alternatively include recesses formed in the first group of the electrodes of the substrate.

Films are formed on inner walls of the through holes, respectively. The films show a given wettability which allows the inner walls of the through holes to be wetted by solder of the solder bumps.

According to a still further aspect of the invention, there is provided a method of soldering an electronic part to a substrate which comprises the steps of: (a) mounting the electronic part having disposed thereon solder bumps on a substrate with the solder bumps being in contact with electrodes on the substrate, respectively, the solder bumps having a melting point greater than a thermal deformation temperature of the electronic part; (b) heating the electronic part mounted on the substrate up to the thermal deformation temperature; and (c) cooling the electronic part mounted on the substrate so as to allow the solder bumps to be solidified at a temperature greater than the thermal deformation temperature.

In the preferred mode of the invention, the step of checking electrical performance of the substrate after the cooling process is provided.

According to a still further aspect of the invention, there is provided a method of soldering an electronic part to a substrate comprising the steps of: (a) providing the electronic part having disposed thereon solder bumps which include a first group and a second group arranged around the first group, the solder bumps of the first group being greater in size than the solder bumps of the second group; (b) mounting the electronic part on a substrate with the solder bumps being in contact with electrodes on the substrate; (c) heating the electronic part mounted on the substrate up to a melting point of the solder bumps; and (d) cooling the electronic part mounted on the substrate to solidify the solder bumps to bond the electronic part to the substrate.

According to a still further aspect of the invention, there is provided a method of soldering an electronic part to a substrate comprising the steps of: (a) providing the electronic part having disposed thereon solder bumps; (b) mounting the electronic part on a substrate with the solder bumps being in contact with electrodes on the substrate, the electrodes including a first group and a second group arranged around the first group, the first group of the electrodes having contact surfaces contacting with the solder bumps which are greater in area than contact surfaces of the electrodes of the second group; (c) heating the electronic part mounted on the substrate up to a melting point of the solder bumps to bond the electronic part to the substrate; and (d) cooling the electronic part mounted on the substrate to solidify the solder bumps to bond the electronic part to the substrate.

According to another aspect of the invention, there is provided a method of soldering an electronic part to a substrate comprising the steps of: (a) providing the electronic part having disposed thereon solder bumps; (b) mounting the electronic part on a substrate with the solder bumps being in contact with electrodes on the substrate, the electrodes including a first group and a second group arranged around the first group, the first group of the electrodes including storage means for storing therein at least part of the solder bumps to be mounted on the first group of the electrodes; (c) heating the electronic part mounted on the substrate up to a melting point of the solder bumps to bond the electronic part to the substrate; and (d) cooling the electronic part mounted on the substrate to solidify the solder bumps to bond the electronic part to the substrate.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

FIGS. 1(a) to 1(d) show a sequence of processes of soldering a circuit element to a substrate according to the present invention.

Figure 1A:
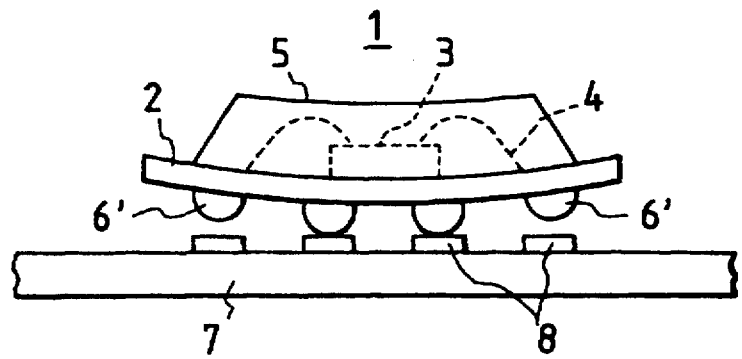
FIGS. 1(a) to 1(d) are side views which show a sequence of processes of soldering an electronic part to a substrate.

FIG. 1(a) shows an electronic part 1 placed on a substrate 7. The electronic part 1 includes an integrated circuit chip 3, a board 2, and solder bumps 6'. The chip 3 is encapsulated by an encapsulating member 5. The solder bumps 6' are formed on the bottom surface of the board 2 in a matrix arrangement, for example, and connected to electrodes of the chip 3 through lead wires 4.

The electronic part 1 is curved for the reasons, as discussed in the introductory part of this application, with some of the peripheral solder bumps 6' being separated from corresponding electrodes 8 printed on the substrate 7. The solder bumps 6' have a melting point of 200° C. which is much greater than a thermal deformation temperature (185° C.) of the electronic part 1. The melting point of the solder bumps 6' may be adjusted by changing a mix of metallic compounds of the solder bumps 6'.

Figure 1B:
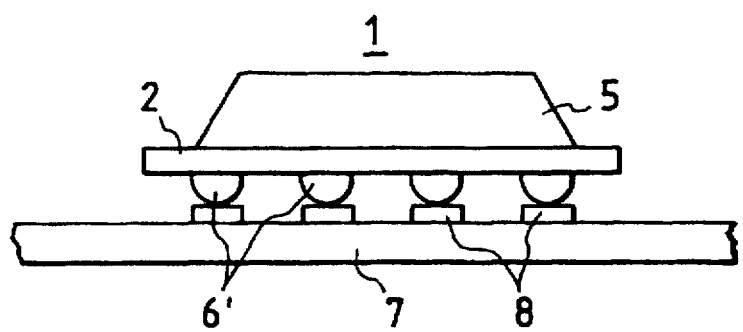
Figure 2:
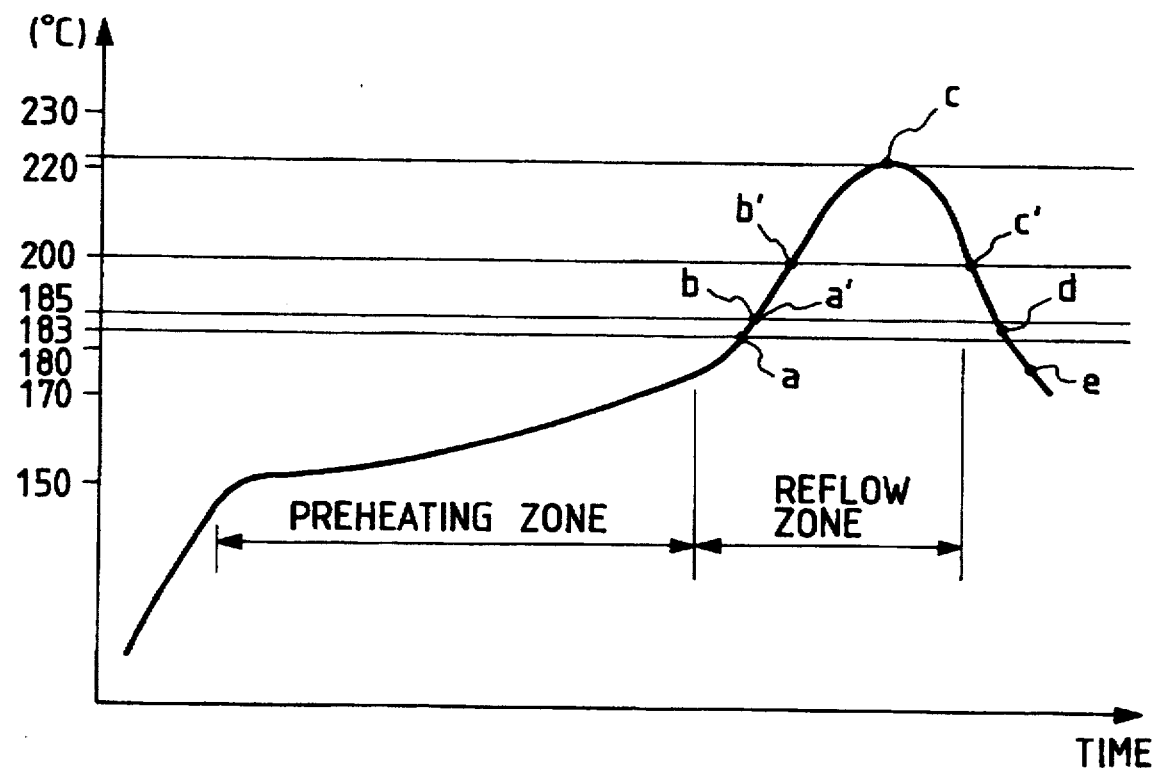
FIG. 2 is a graph which shows a temperature profile of a heating furnace during a soldering process.

After the electronic part 1 is mounted on the substrate 7 in place, they are put into a reflow heating furnace. The electronic part 1 and the substrate 7 are heated quickly from the room temperature up to about 150° C. and then heated slowly up to about 170° over a preheating zone, as shown in FIG. 2. Subsequently, the electronic part 1 and the substrate 7 are heated again quickly over a reflow zone until 185° C. is reached at a point a' which is a thermal deformation temperature of the board 2. When 185° C. is reached, the set of the electronic part 1 is, as shown in FIG. 1(b), cured so that the solder bumps 6' are all brought into constant engagement with the electrodes 8.

Figure 1C:
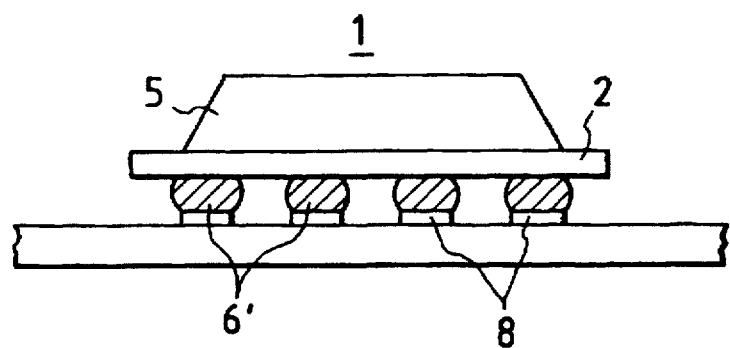

The electronic part 1 and the substrate 7 are further heated up to a point b' of 200° C. which is a melting point of the solder bumps 6', so that the solder bumps 6' are fused. The electronic part 1 and the substrate 7 continue to be heated up to a point c indicating a maximum temperature of 230° C. FIG. 1(c) shows the electronic part 1 at 230° C. with the solder bumps 6' being molten completely on the electrodes 8.

Figure 1D:
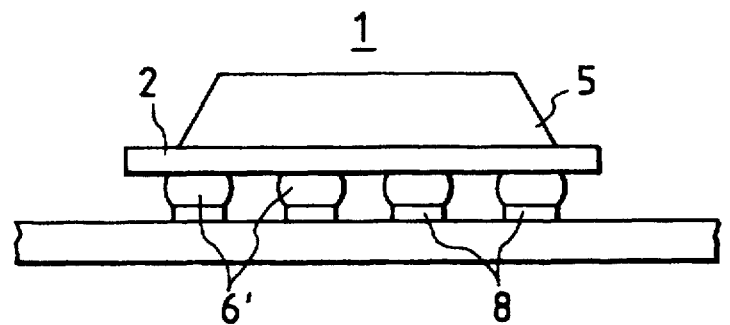
Figure 8A:
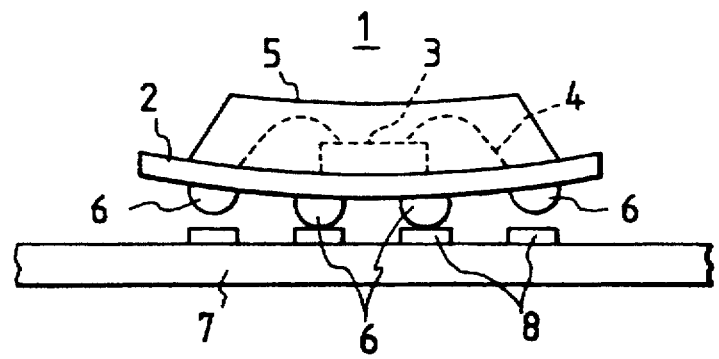
FIGS. 8(a) to 8(d) are side views which show a sequence of conventional soldering processes.
Figure 8B:
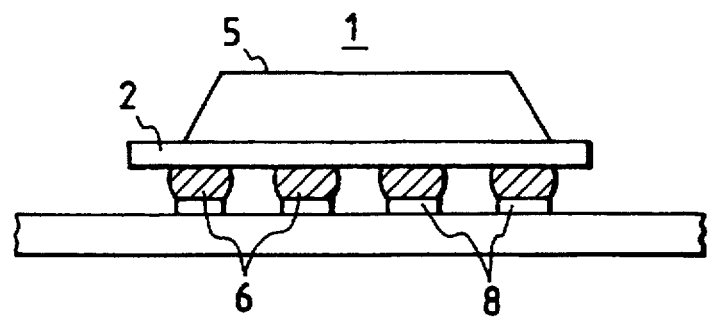
Figure 8C:
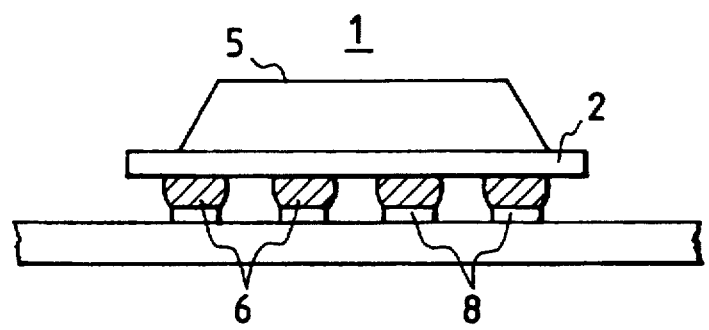
Figure 8D:
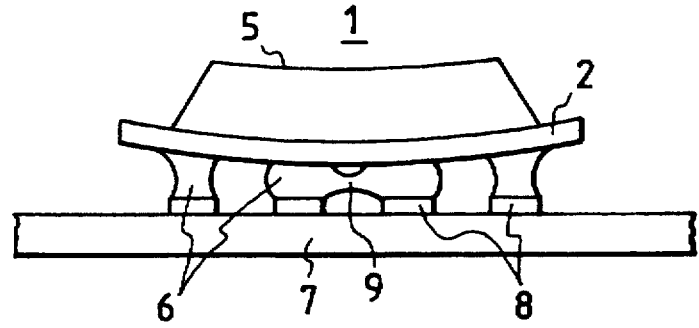

After the maxmum temperature is reached, the electronic part 1 and the substrate 7 are cooled quickly. When the temperature in the furnace is decreased to 200° C. at a point c', the solder bumps 6' are solidified. Subsequently, when the temperature of the substrate 7 is decreased below 185° C. (point O which is the thermal deformation temperature of the board 2, it will cause the board 2 to be curved again, as already discussed with reference to FIG. 8(d), but the solder bumps 6' have already been solidified, thereby preventing the board 2 from being curved. Thus, the electronic part 1, as shown in FIG. 1(d), remains flat with the solder bumps 6' being bonded to the electrodes 8 correctly.

Figure 3:
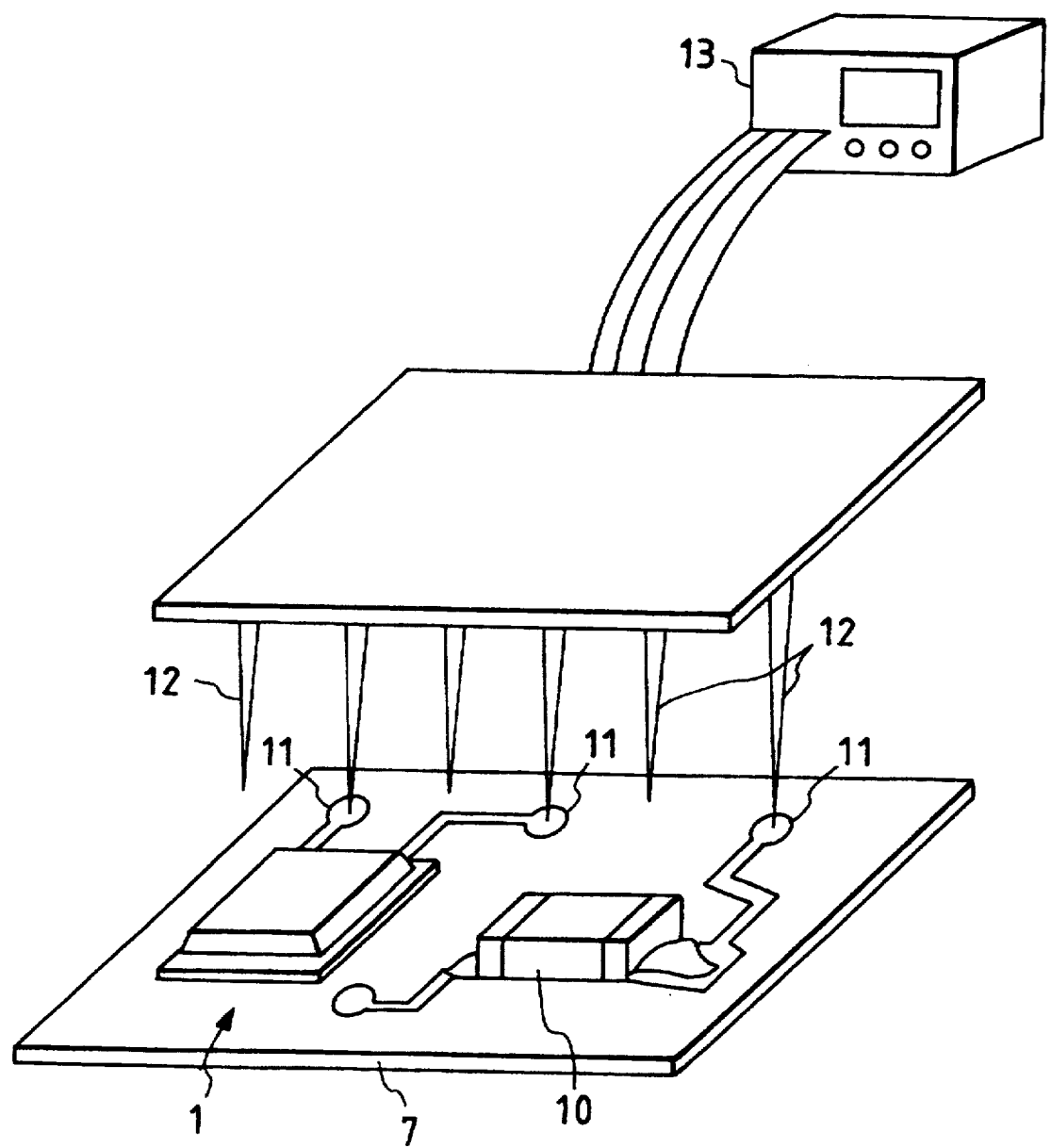
FIG. 3 is a perspective view which shows an electronic performance test machine which checks the electronic performance of a substrate to which an electronic part is soldered.

After completion of the soldering process, as discussed above, the substrate 7 is checked for electrical performance. FIG. 3 shows an electrical performance test machine which includes a test analyzer 13 and probes 12.

The probes 12 are electrically connected at their tips to pads 11 of the substrate 7 to which the electronic part 1 and a square electronic component 10 are soldered. The probes 12 are connected to the text analyzer 13 for checking the electronic performance of the substrate 7. If the substrate 7 operates normally, then it is subjected to a subsequent process. Alternatively, if the substrate 7 malfunctions, it is withdrawn from a production line.

Figure 4A:
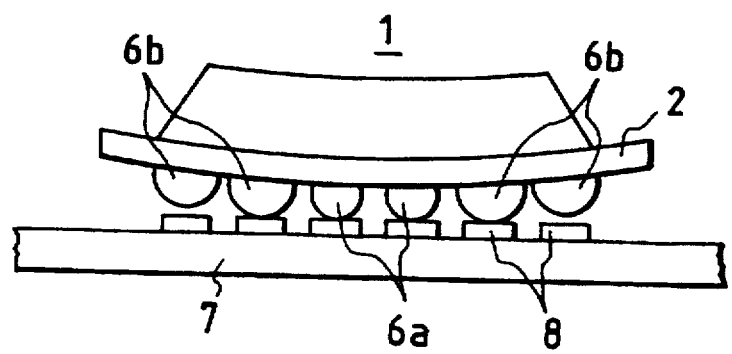
FIGS. 4(a) to 4(c) are side views which show a sequence of processes of soldering an electronic part to a substrate according to the second embodiment.
Figure 4B:
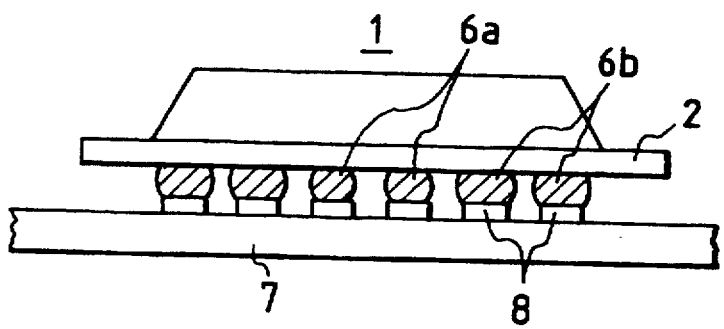
Figure 4C:
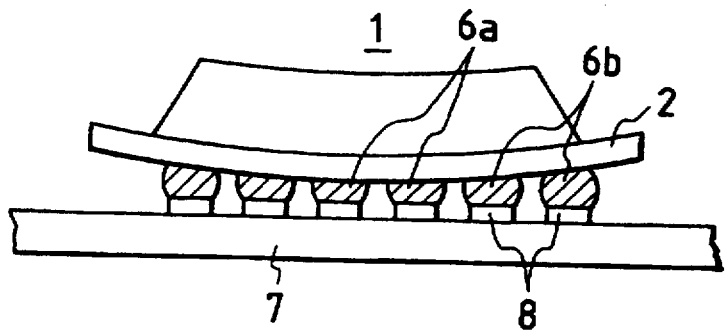

FIGS. 4(a) to 4(c) show a sequence of soldering processes according to the second embodiment of the present invention.

In this embodiment, central solder bumps 6a are smaller in size than peripheral bumps 6b. The solder bumps 6a and 6b have a typical melting point of 183° C.

First, the electronic part 1 is, as shown in FIG. 4(a), placed on the substrate 7. The peripheral solder bumps 6b are separate from the corresponding electrodes 8, respectively, due to the set of the electronic part 1. The electronic part 1 and the substrate 7 are then put into the reflow heating furnace and heated to fuse the solder bumps 6a and 6b. When the electronic part 1 and the substrate 7 are cooled, the solder bumps 6a and 6b are solidified to bond the electronic part 1 to the substrate 7. Subsequently, the substrate 7 Is check for electrical performance in the manner as discussed with reference to FIG. 3.

Since the melting point of the solder bumps 6a and 6b is, as described above, 183° C. that is lower than the thermal deformation temperature of the electronic part 1 (e.g., more than 185° C.), when the electronic part 1 is curved during the cooling process, as discussed in the above first embodiment, it will cause the solder bumps 6a and 6b to be pressed against the substrate 7, as shown in FIG. 4(c). Particularly, the central solder bumps 6a are compressed by the board 2. The central solder bumps 6a are, however, smaller in size than the peripheral solder bumps 6b for preventing the central solder bumps 6a from expanding laterally which would cause bridges to be formed between adjacent ones of the central solder bumps 6a.

Figure 5A:
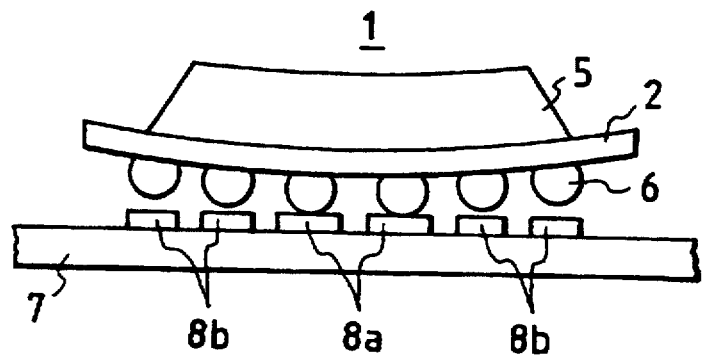
FIGS. 5(a) to 5(c) are side views which show a sequence of processes of soldering an electronic part to a substrate according to the third embodiment.
Figure 5B:
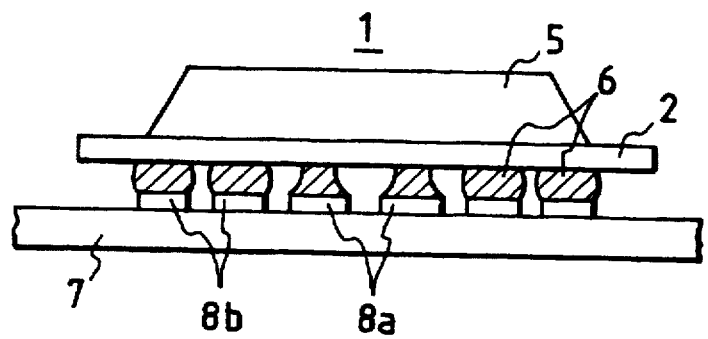
Figure 5C:
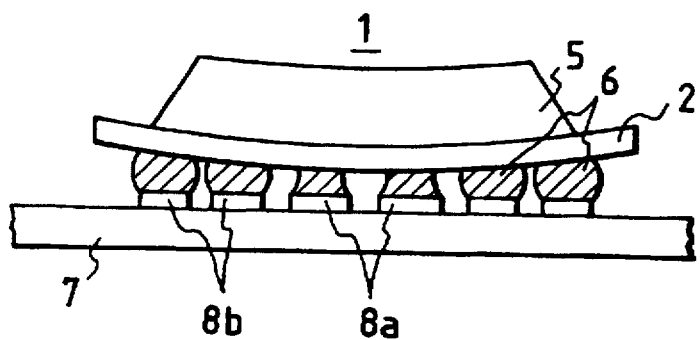

FIGS. 5(a) to 5(c) show a sequence of soldering processes according to the third embodiment of the present invention.

Figure 6A:
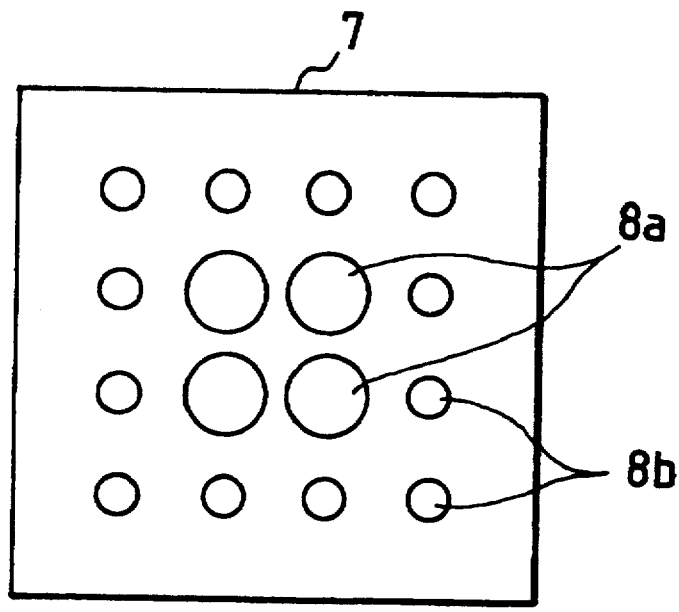
FIG. 6(a) is a top view which shows an electrode arrangement on a substrate.

The electrodes 8 are, as shown in FIG. 6(a), disposed in a matrix arrangement on the substrate 7 and includes central electrodes 8a and peripheral electrodes 8b arranged around the central electrodes 8a. The central electrodes 8a each have an upper contact surface smaller in area than those of the peripheral electrodes 8b. The solder bumps 6 are all made of round solder members of substantially same diameter having the melting point of 183° C.

First, the electronic part 1 is, as shown in FIG. 5(a), placed on the substrate 7. The peripheral solder bumps 6 are separate from the corresponding electrodes 8, respectively, due to the set of the electronic part 1. The electronic part 1 and the substrate 7 are then put into the reflow heating furnace and heated to fuse the solder bumps 6, as shown in FIG. 5(b). When the electronic part 1 and the substrate 7 are cooled, the solder bumps 6 are, as shown in FIG. 5(c), solidified to bond the electronic part 1 to the substrate 7.

Since the solder bumps 6 have the melting point lower than the thermal deformation temperature of the electronic part 1, when the electronic part 1 is curved during the cooling process, it will cause the molten solder bumps 6 to be pressed against the substrate 7 and then deformed, but central four of the bumps 6 spread in substantially a trapezoid form over upper surfaces of the central electrodes 8a without being expanded laterally. Thus, bridges are not formed between adjacent ones of the central solder bumps 6.

Figure 6B:
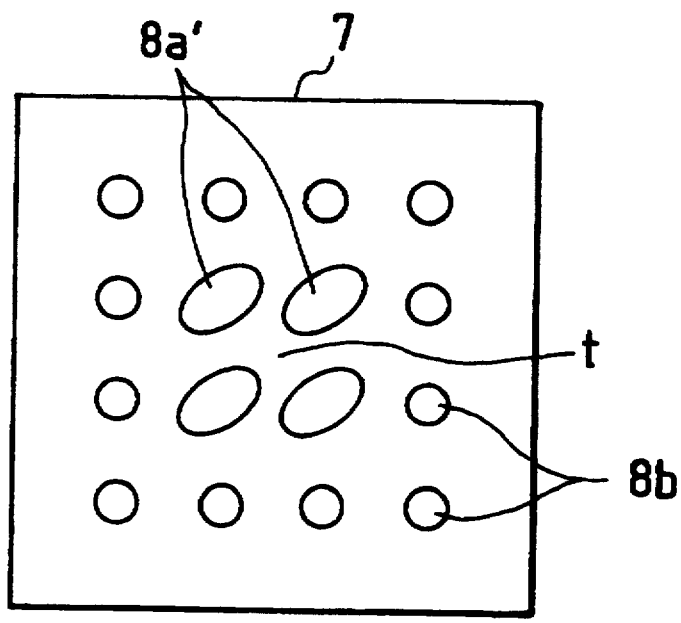
FIG. 6(b) is a top view which shows a modification of an electrode arrangement on a substrate.

The central electrodes 8a may be formed with disc members, as shown in FIG. 6(a), rectangular members, or elongated disc members such as oval members, as shown in FIG. 6(b). It is preferable that the oval electrodes 8' have major axes (or minor axes) oriented in parallel to each other for maxiizing intervals t between adjacent ones of the oval electrodes 8a'.

Figure 7A:
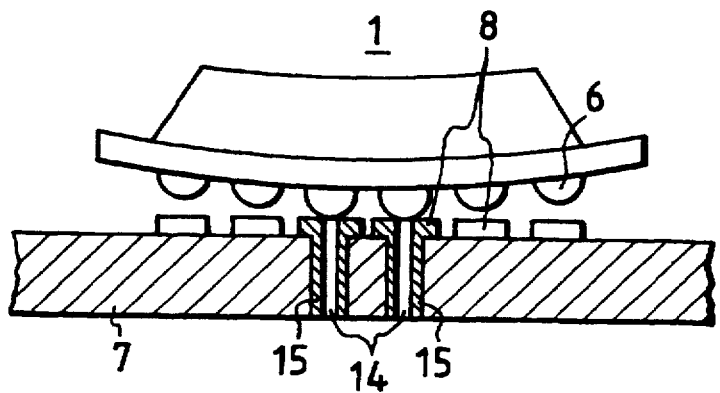
FIGS. 7(a) to 7(c) are side views which show a sequence of processes of soldering an electronic part to a substrate according to the fourth embodiment.
Figure 7B:
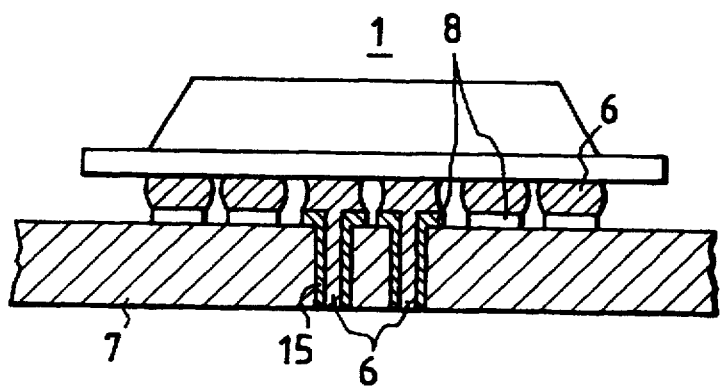
Figure 7C:
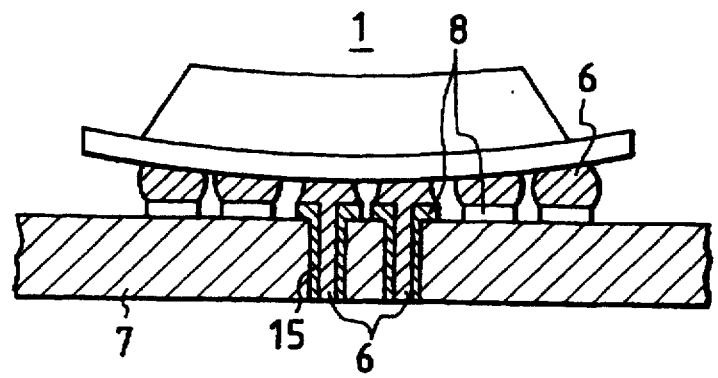

FIGS. 7(a) to 7(c) show a sequence of soldering processes according to the fourth embodiment of the present invention.

The substrate 7 has formed in its central portion through holes 14. Inner walls of the through holes 14 are coated with metallic thin films 15, respectively, that show good solder wettability (also called solderability). Other arrangements are identical with those of the first embodiment.

The electronic part 1 is, as shown in FIG. 7(a), first placed on the substrate 7. The peripheral solder bumps 6 are separate from the corresponding electrodes 8, respectively, due to the set of the electronic part 1. The electronic part 1 and the substrate 7 are then put into the reflow heating furnace and heated to melt the solder bumps 6, as shown in FIG. 7(b). The molten central bumps 6 then partly flow into the through holes 14.

When the electronic part 1 and the substrate 7 are cooled, the solder bumps 6 are, as shown in FIG. 7(c), solidified to bond the electronic part 1 to the electrodes 8 on the substrate 7.

Since the solder bumps 6 have the melting point lower than the thermal deformation temperature of the electronic part 1, when the electronic part 1 is curved during the cooling process, it will cause the molten solder bumps 6 to be pressed against the substrate 7 and then deformed. The part of the central solder bumps 6, however, flow into the through holes 14, thereby preventing the central solder bumps 6 from spreading to form the bridges. The films 15 coated on the inner walls of the through holes 14 serve to facilitate the flow of the molten solder bumps 6 into the through holes 14.

Instead of the through holes 14, recessed portions may be formed in upper surfaces of the electrodes 8. The recessed portions may also be coated with metallic films having good solder wettability.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An electronic part comprising:

a board;

a circuit element having electrodes, disposed on said board;

an encapsulating member disposed on said board so as to encapsulate said circuit element; and solder bumps disposed on said board, each connected to one of the electrodes of said circuit element, said solder bumps being made of solder having a melting point greater than a thermal deformation temperature of said board.

2. A method of soldering an electronic part to a substrate comprising the steps of:

mounting the electronic part having disposed thereon solder bumps on a substrate with the solder bumps being in contact with electrodes on the substrate, respectively, the electronic part including a board, a circuit element disposed on the board, and an encapsulating member disposed on the board so as to encapsulate the circuit element, the solder bumps having a melting point greater than a thermal deformation temperature of the board;

heating the electronic part mounted on the substrate up to the thermal deformation temperature of the board;

heating the electronic part up to a melting point of the solder bumps; and cooling the electronic part to allow the solder bumps to be solidified at a temperature greater than the thermal deformation temperature of the board.

3. An electronic part as set forth in claim 1, wherein the solder of said solder bumps has the melting point greater than the thermal deformation temperature of said board for minimizing warping of said board due to difference in thermal expansion coefficient between said board and said encapsulating member.

4. A method as set forth in claim 2, further comprising the step of selecting a solder for said solder bumps having said melting point greater than the thermal deformation temperature of said board for minimizmng warping of said board after reflowing due to difference in thermal expansion coefficient between said board and said encapsulating member.

5. An electronic part as set forth in claim 1, wherein said circuit element is disposed on a first surface of said board, said solder bumps being disposed on a second surface of said circuit board opposite the first surface.

6. An electronic part as set forth in claim 1, further comprising an encapsulating member encapsulating said circuit element using a given molding material, and wherein the melting point of said solder bumps is also greater than a thermal deformation temperature of said encapsulating member.

7. A method as set forth in claim 2, further comprising the step of checking electrical performance of the substrate after said cooling process.

* * * * *